(12) United States Patent
Tokumitsu et al.

(10) Patent No.: US 11,289,363 B2
(45) Date of Patent: Mar. 29, 2022

(54) SEMICONDUCTOR DEVICE AND METHOD OF MANUFACTURING THE SAME

(71) Applicant: RENESAS ELECTRONICS CORPORATION, Tokyo (JP)

(72) Inventors: Shigeo Tokumitsu, Tokyo (JP); Yoshiki Maruyama, Tokyo (JP); Satoshi Iida, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days.

(21) Appl. No.: 16/872,766

(22) Filed: May 12, 2020

(65) Prior Publication Data

US 2020/0411360 A1 Dec. 31, 2020

(30) Foreign Application Priority Data

Jun. 28, 2019 (JP) .............................. JP2019-121420

(51) Int. Cl.

| | |
|---|---|
| *H01L 21/74* | (2006.01) |
| *H01L 23/48* | (2006.01) |
| *H01L 23/528* | (2006.01) |
| *H01L 21/768* | (2006.01) |
| *H01L 29/66* | (2006.01) |
| *H01L 21/306* | (2006.01) |

(52) U.S. Cl.
CPC ...... *H01L 21/743* (2013.01); *H01L 21/30604* (2013.01); *H01L 23/481* (2013.01); *H01L 23/528* (2013.01)

(58) Field of Classification Search
CPC ............. H01L 21/743; H01L 21/30604; H01L 23/481; H01L 23/528
See application file for complete search history.

(56) References Cited

U.S. PATENT DOCUMENTS

| | | | |
|---|---|---|---|
| 2014/0051246 A1* | 2/2014 | Kim ................. | H01L 21/30625 438/666 |
| 2015/0041960 A1* | 2/2015 | Morii .................... | H01L 21/743 257/621 |
| 2018/0130900 A1* | 5/2018 | Usami .................. | H01L 21/743 |

FOREIGN PATENT DOCUMENTS

JP 2015-037099 A 2/2015

\* cited by examiner

*Primary Examiner* — Herve-Louis Y Assouman
(74) *Attorney, Agent, or Firm* — McDermott Will & Emery LLP

(57) ABSTRACT

A method of manufacturing a semiconductor device includes: providing a substrate, forming a first opening, forming a first insulating layer, forming a second opening, embedding a conductive layer, forming a protective layer, and performing CMP. The substrate includes a semiconductor substrate and a semiconducting layer. The conductive layer is embedded in the second opening so that a gap along a thickness direction of the semiconducting layer is formed. The protective layer is formed in the second opening on at least a portion of a surfaces of the conductive layer. In the CMP step, a portion of the conductive layers formed outside the second opening is removed.

14 Claims, 21 Drawing Sheets

SEMICONDUCTOR DEVICE AND METHOD OF MANUFACTURING THE SAME

CROSS-REFERENCE TO RELATED APPLICATIONS

The disclosure of Japanese Patent Application No. 2019-121420 filed on Jun. 28, 2019 including the specification, drawings and abstract is incorporated herein by reference in its entirety.

BACKGROUND

It relates to a semiconductor device and a method of manufacturing the semiconductor device, for example a semiconductor device and a method of manufacturing the semiconductor device including a conductive layer for substrate contact.

There is a disclosed technique listed below.
[Patent Document 1] Japanese Unexamined Patent Application Publication No. 2015-037099

A semiconductor device including a conductive layer for substrate contact is known. The semiconductor device includes a semiconductor substrate, a semiconducting layer formed on the semiconductor substrate, and a conductive layer for substrate contact. The conductive layer for substrate contact penetrates the semiconductor layer such that the conductive layer reaches the semiconductor substrate in a thickness direction of the semiconductor layer (for example, see Patent Document 1).

The substrate contact is formed by forming an opening in the semiconductor layer so as to reach the semiconductor substrate and then embedding the opening with the conductive layer. The conductive layer formed outside the opening is removed by CMP method.

When the opening is embedded with the conductive layer, a gap surrounded within the conductive layer may be formed in the opening. A chemical solution used in CMP step enter the gap, whereby a reaction product of a material of the conductive layer and a component of the chemical solution may be formed on substrate contact. Therefore, in a conventional semiconductor device, leakage may occur between two wiring adjacent to each other due to the reaction product. As described above, a conventional method of manufacturing the semiconductor device includes a room for improvement from the viewpoint of improving the reliability of semiconductor device.

It is a problem of embodiments to improve the reliability of the semiconductor device. Other problems and novel features will become apparent from the description of the specification and drawings.

SUMMARY

A method of manufacturing a semiconductor device according to embodiments includes providing a substrate, forming a first opening, forming a first insulating layer, forming a second opening, embedding a conductive layer, forming a protective layer, and performing CMP. The conductive layer is embedded in the second opening such that a gap is formed along a thickness direction of the semiconductor layer. The protective layer is formed on at least a portion of a surface of the conductive layer in second opening.

A semiconductor device according to embodiments includes a substrate, a first insulating layer, a conductive layer, and a protective layer. The substrate includes a semiconductor substrate and a semiconductor layer. An opening penetrating the semiconductor layer is formed in the substrate such that the opening reaches the semiconductor substrate in a thickness direction of the semiconductor layer. The conductive layer is formed such that a gap along the thickness direction of the semiconductor layer reaches the semiconductor substrate in the opening. The protective layer is formed on at least a portion of the surface of the conductive layer in the gap.

According to the embodiments, the reliability of the semiconductor device can be enhanced.

DETAILED DESCRIPTION

Figure 1:
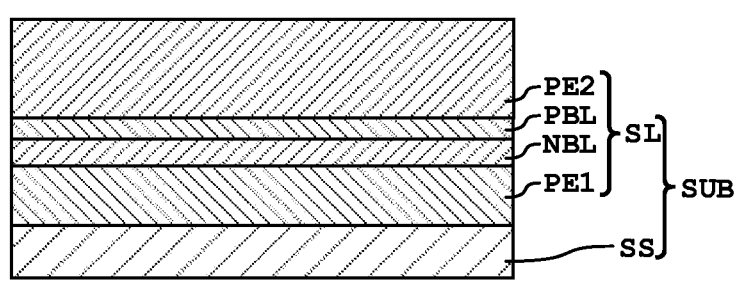
FIG. 1 is a cross-sectional view showing an exemplary step included in a method of manufacturing a semiconductor device according to an embodiment.

Hereinafter, a semiconductor device according to an embodiment and a method of manufacturing the semiconductor device will be described in detail by referring to the drawings. In the specification and the drawings, the same or corresponding form elements are denoted by the same reference numerals, and a repetitive description thereof is omitted. In the drawings, for convenience of description, the configuration may be omitted or simplified. A cross-sectional view may be shown as an end view. At least some of the embodiment and each modification may be arbitrarily combined with each other.

[Method of Manufacturing Semiconductor Device]

FIGS. 1-16 are cross-sectional views showing exemplary steps included in a method of manufacturing a semiconductor device SD according to a present embodiment. FIG. 10 is a partially enlarged cross-sectional view showing an area indicated by a broken line in FIG. 9. FIG. 12 is a partially enlarged cross-sectional view showing an area indicated by a broken line in FIG. 11. FIG. 14 is a partially enlarged cross-sectional view showing an area indicated by a broken line in FIG. 13.

A method of manufacturing a semiconductor device SD according to the present embodiment includes (1) providing a substrate SUB, (2) forming a semiconductor element SE, (3) forming a first insulating layer IL1, (4) forming a second insulating layer IL2, (5) forming a first opening OP1, (6) forming a third insulating layer IL3, (7) forming a second opening OP2 and a contact hall CH, (8) forming a conductive layer CL, (9) forming a protective layer PL, (10) performing CMP, (11) forming a wiring layer WRL, and (12) forming a passivation film PV.

(1) Providing a Substrate SUB

First, as shown in FIG. 1, a substrate SUB is provided. The substrate SUB includes a semiconductor substrate SS and a semiconductor layer SL.

The semiconductor substrate SS is, for example, a p-type semiconductor substrate containing a p-type impurity or an n-type semiconductor substrate containing an n-type impurity. Examples of the p-type impurities include boron (B) and aluminum (Al). Examples of the n-type impurity include arsenic (As) and phosphorus (P).

The semiconductor layer SL is a stacked film in which a first p-type epitaxial layer PE1, an n-type buried layer NBL, a p-type buried layer PBL, and a second p-type epitaxial layer PE2 are stacked in this order. The semiconductor layer SL is formed on the semiconductor substrate layer SS. The n-type buried layer NBL and the p-type buried layer PBL are not essential elements. From the viewpoint of junction isolation with substrate SUB and device characteristics, the semiconductor layer SL preferably includes the n-type buried layer NBL or the p-type buried layer PBL.

The first p-type epitaxial layer PE1 is formed on a surface of the semiconductor substrate SS by, for example, epitaxial method. The first p-type epitaxial layer PE1 contains the p-type impurity. An impurity concentration of the first p-type epitaxial layer PE1 is, for example, $1 \times 10^{13}$ cm$^{-3}$ or more and $1 \times 10^{19}$ cm$^{-3}$ or less.

The n-type buried layer NBL is formed, for example, by implanting an n-type impurity into a portion or entire of an upper surface of the first p-type epitaxial layer PE1. Examples of the n-type impurities include phosphorus (P) and arsenic (As). An impurity concentration of the n-type buried layer NBL is, for example, $1 \times 10^{13}$ cm$^{-3}$ or more and $1 \times 10^{19}$ cm$^{-3}$ or less.

The p-type buried layer PBL is formed, for example, by implanting a p-type impurity into a portion or entire of an upper surface of the n-type buried layer NBL. An impurity concentration of the p-type buried layer PBL is, for example, $1 \times 10^{15}$ cm$^{-3}$ or more and $1 \times 10^{21}$ cm$^{-3}$ or less.

The second p-type epitaxial layer PE2 is formed on the p-type buried layer PBL by, for example, epitaxial method. The second p-type epitaxial layer PE2 contain the p-type impurity. An impurity concentration of the second p-type epitaxial layer PE2 is, for example, $1 \times 10^{13}$ cm$^{-3}$ or more and $1 \times 10^{19}$ cm$^{-3}$ or less.

(2) Forming a Semiconductor Element

Figure 2:
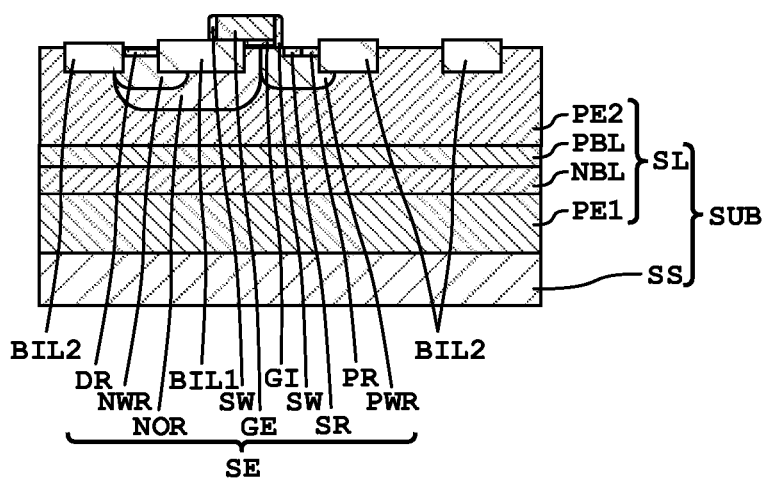
FIG. 2 is a cross-sectional view showing an exemplary step included in the method of manufacturing the semiconductor device according to the embodiment.

Substantially, as shown in FIG. 2, a semiconductor element SE and a second buried insulating layer BIL2 are formed on a main surface of the substrate SUB. Here, the main surface of the substrate SUB is a plane mainly constituting a surface of the substrate SUB. The semiconductor element SE is not particularly limited, and the semiconductor element SE may be a planar MOSFET or a LDMOSFET (laterally diffused MOSFET). In the present embodiment, the semiconductor element SE is a laterally diffused MOSFET. The method of forming the semiconductor element SE is not particularly limited, and a known method can be employed as a method of forming the semiconductor element.

In the present embodiment, the semiconductor element SE includes a p-type well region PWR, an n-type offset region NOR, an n-type well region NWR, a source region SR, a P+ region PR, a drain region DR, a first buried insulating layer BIL1, a gate insulating film GI, a gate electrode GE, and a sidewall insulating film SW.

The p-type well region PWR is formed by implanting p-type impurities into a portion of a main surface of second p-type epitaxial layer PE2. An impurity concentration of the p-type well region PWR is, for example, $1 \times 10^{14}$ cm$^{-3}$ or more and $1 \times 10^{21}$ cm$^{-3}$ or less. The position and size of the p-type well region PWR can be appropriately adjusted in accordance with desired device characteristics.

The n-type offset region NOR is formed by implanting an n-type impurity into a region of the second p-type epitaxial layer PE2 adjacent to the p-type well region PWR. An impurity concentration of the p-type well region PWR is, for example, $1 \times 10^{14}$ cm$^{-3}$ or more and $1 \times 10^{21}$ cm$^{-3}$ or less. The position and size of the n-type offset region NOR can be appropriately adjusted in accordance with desired device characteristics.

The n-type well region NWR is formed by implanting an n-type impurity into a portion of the n-type offset region NOR. An impurity concentration of the n-type well region NWR is, for example, $1 \times 10^{14}$ cm$^{-3}$ or more and $1 \times 10^{21}$ cm$^{-3}$ or less. The position and size of the n-type well region NWR can be appropriately adjusted in accordance with desired device characteristics.

The source region SR is formed by implanting a p-type impurity into a portion of the p-type well region PWR. An impurity concentration of the source region SR is, for example, $1\times10^{15}$ cm$^{-3}$ or more and $1\times10^{21}$ cm$^{-3}$ or less. The position and size of the source region SR can be appropriately adjusted in accordance with desired device characteristics.

The P+ region PR is formed by implanting a p-type impurity into a region of the p-type well region PWR adjacent to the source region SR. An impurity concentration of the P+ region PR is, for example, $1\times10^{15}$ cm$^{-3}$ or more and $1\times10^{21}$ cm$^{-3}$ or less. The position and size of the P+ region PR can be appropriately adjusted in accordance with desired device characteristics.

The drain region DR is formed by implanting an n-type impurity into a portion of the n-type well region NWR. An impurity concentration of the drain region DR is, for example, $1\times10^{14}$ cm$^{-3}$ or more and $1\times10^{21}$ cm$^{-3}$ or less. The position and size of the drain region DR may be appropriately adjusted in accordance with desired device characteristics.

The first buried insulating layer BIL1 is formed to adjacent to the n-type well region NWR and the n-type offset region NOR on the main surface of the semiconductor layer SL. The first buried insulating layer BIL1 may be formed by burying a recess formed on the main surface of the semiconductor layer SL with an insulating film. The first buried insulating layer BIL1 may be formed by oxidizing a portion of the main surface of the semiconductor layer SL by LOCOS method. The first buried insulating layer BIL1 is made of, for example, silicon oxide (SiO$_2$).

The Gate insulating film GI is formed on a portion of the main surface of the semiconductor layer SL located between the source region SR and the first buried insulating layer BIL1. The material of gate insulating film GI is, for example, silicon oxide (SiO$_2$).

The gate electrode GE is formed on the gate insulating film GI and the first buried insulating layer BIL1. The material of the gate electrode GE is, for example, polysilicon.

The sidewall insulating films SW are formed on both sidewalls of the gate electrode GE, respectively. The sidewall insulating film SW is made of, for example, silicon oxide (SiO$_2$).

The second embedded insulating layer BIL2 is formed such that the second embedded insulating layer BIL2, in a plan view, surround the p-well region PWR, the n-type offset region NOR, the n-type well region NWR, the source region SR, the P+ region PR, and the drain region DR. The second buried insulating layer BIL2 may be formed by burying a recess formed on the main surface of the semiconductor layer SL with an insulating film. The second buried insulating layer BIL2 may be formed by oxidizing a portion of the main surface of the semiconductor layer SL by LOCOS method. The second buried insulating layer BIL2 is made of, for example, silicon oxide (SiO$_2$).

The first embedded insulating layer BIL1 and the second embedded insulating layer BIL2 may be formed by the same method as each other, or may be formed by a different method from each other. In the present embodiment, the first buried insulating layer BIL1 and the second buried insulating layer BIL2 are formed in the same manner as each other, and more specifically, they are formed by burying recess formed on the main surface of the semiconductor layer SL with an insulating film.

(3) Forming a First Insulating Layer

Figure 3:
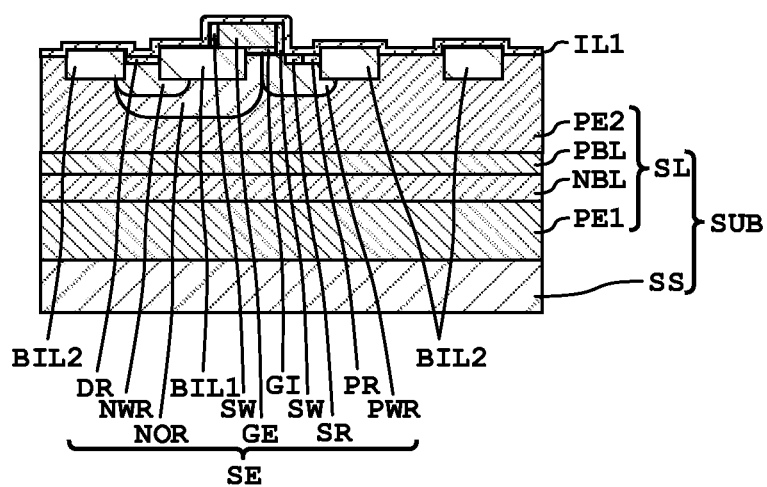
FIG. 3 is a cross-sectional view showing an exemplary step included in the method of manufacturing the semiconductor device according to the embodiment.

Substantially, as shown in FIG. 3, a first insulating layer IL1 is formed on the substrate SUB so as to cover the semiconductor element SE and the second buried insulating layer BIL2. The first insulating layer IL1 is formed by, for example, CVD (chemical vapor deposition) method. The first insulating layer IL1 is made of silicon nitride (SiN). A thickness of the first insulating layer IL1 is 10 nm or more and 100 nm or less.

(4) Forming a Second Insulating Layer IL2

Figure 4:
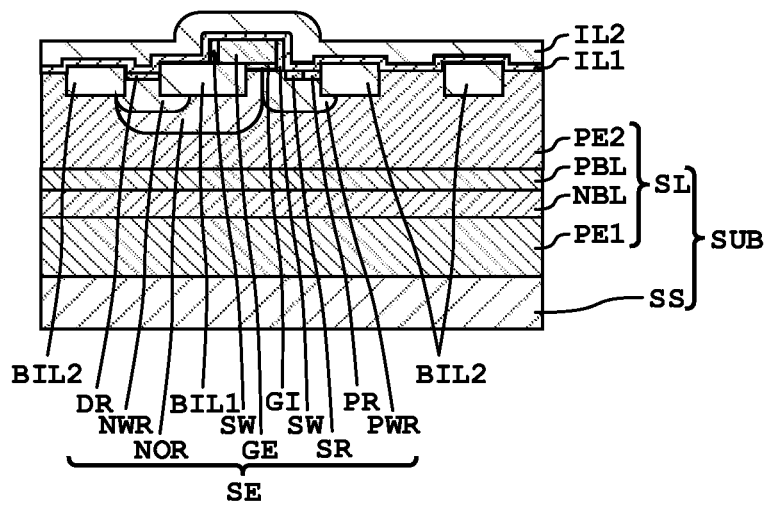
FIG. 4 is a cross-sectional view showing an exemplary step included in the method of manufacturing the semiconductor device according to the embodiment.

Substantially, as shown in FIG. 4, a second insulating layer IL2 is formed on the first insulating layer IL1. The method of forming the second insulating layer IL2 is, for example, CVD method. The second insulating layer IL2 is made of silicon oxide (SiO$_2$). A thickness of second insulating layer IL2 is 50 nm or more and 1 µm or less.

(5) Forming a First Opening

Figure 5:
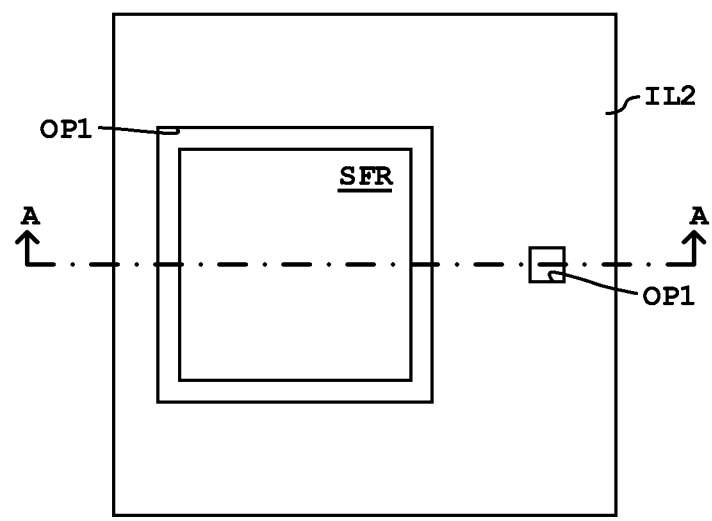
FIG. 5 is a cross-sectional view showing an exemplary step included in the method of manufacturing the semiconductor device according to the embodiment.
Figure 6:
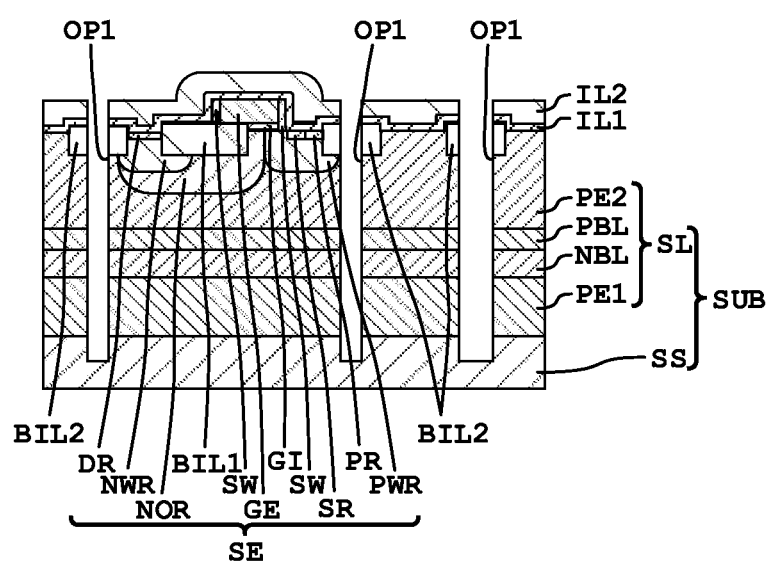
FIG. 6 is a cross-sectional view showing an exemplary step included in the method of manufacturing the semiconductor device according to the embodiment.

Substantially, as shown in FIG. 5 and FIG. 6, a first opening OP1 extending to reach the semiconductor substrate SS along a thickness direction of the semiconductor layer SL and penetrating the semiconductor layer SL is formed. In the present embodiment, the first opening OP1 surrounding the semiconductor element SE and the first opening OP1 for substrate contact are formed. The first opening OP1 surrounding the semiconductor element SE defines an element forming area SFR. The first opening OP1 for substrate contact is formed on the outer side of the device forming area SFR. In the present embodiment, the first opening OP1 penetrates through the second insulating layer IL2, the first insulating layer IL1, the second buried insulating layer BIL2, and the semiconductor layer SL. The method of forming the first opening OP1 is, for example, dry-etching method.

(6) Forming a Third Insulating Layer IL3

Figure 7:
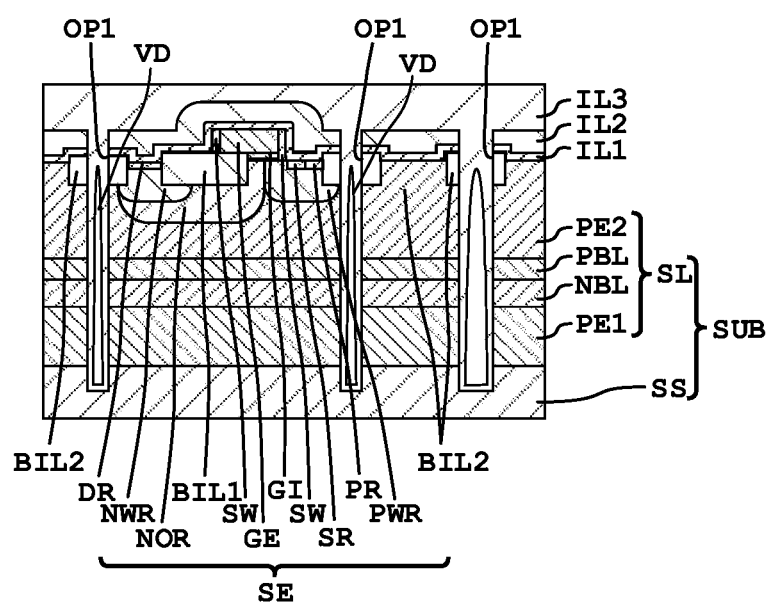
FIG. 7 is a cross-sectional view showing an exemplary step included in the method of manufacturing the semiconductor device according to the embodiment.

Subsequently, a as shown in FIG. 7, a third insulating layer IL3 is formed in the first opening OP1 and on the second insulating layer IL2. In this instance, a void VD is preferably formed in the first opening OP1. The void VD extends along the thickness direction of the semiconductor layer SL. By forming the void VD in the first opening OP1, it is possible to suppress warpage of the substrate SUB due to stresses generated in the substrate SUB.

(7) Forming a Second Opening OP2 and a Contact Hole CH

Figure 8:
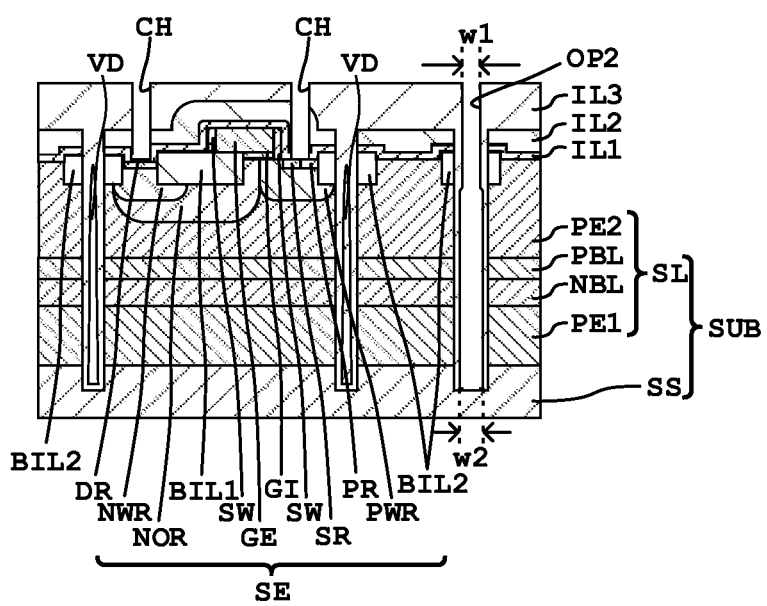
FIG. 8 is a cross-sectional view showing an exemplary step included in the method of manufacturing the semiconductor device according to the embodiment.

Subsequently, as shown in FIG. 8, a second opening OP2 and a contact hole CH extending along the thickness direction of the semiconductor layer SL are formed. The method of forming the second opening OP2 and the contact hole CH is, for example, dry-etching method.

The second opening OP2 is formed such that the third insulating layer IL3 remains on an inner surface of the first opening OP1, and such that the semiconductor substrate SS is exposed from third insulating layer IL3. The second opening OP2 is formed by forming a through hole communicating with the first opening OP1 in third insulating layer IL3. The second opening OP2 penetrates through the third insulating layer IL3, the second insulating layer IL2, the first insulating layer IL1, the second buried insulating layer BIL2 and the semiconductor layer SL so as to reach the semiconductor substrate SS.

As shown in FIG. 8, a width of an upper portion of the second opening OP2 is smaller than a width of a lower part of the second opening OP2. For example, a first width w1 of a portion of the second opening OP2 located in the same plane as an upper surface of the second insulating layer IL2 is smaller than a second width w2 of a portion located in the same plane as an upper surface of the semiconductor substrate SS. It is preferable that the first width w1 is smaller than the second width w2 from the viewpoint of enhancing the embedding property of the conductive layer CL.

The first width w1 is preferably large from the viewpoint of reducing a resistance of substrate contact. The first width w1 is preferably small from the viewpoint of reducing the stress generated by the conductive layer CL. For example, the first width w1 is preferably 100 nm or more and 1 µm or less.

The second width w2 is preferably large from the viewpoint of reducing the resistance of substrate contact. The second width w2 is appropriately determined in accordance with the size of the first opening OP1. For example, the second width w2 is preferably 100 nm or more.

The contact hole CH penetrates the third insulating layer IL3, the second insulating layer IL2, and the first insulating layer IL1. The contact holes CH reaching the source region SR and the P+ region PR and the contact hole CH reaching the drain region DR are formed.

(8) Forming a Conductive Layer CL

Figure 9:
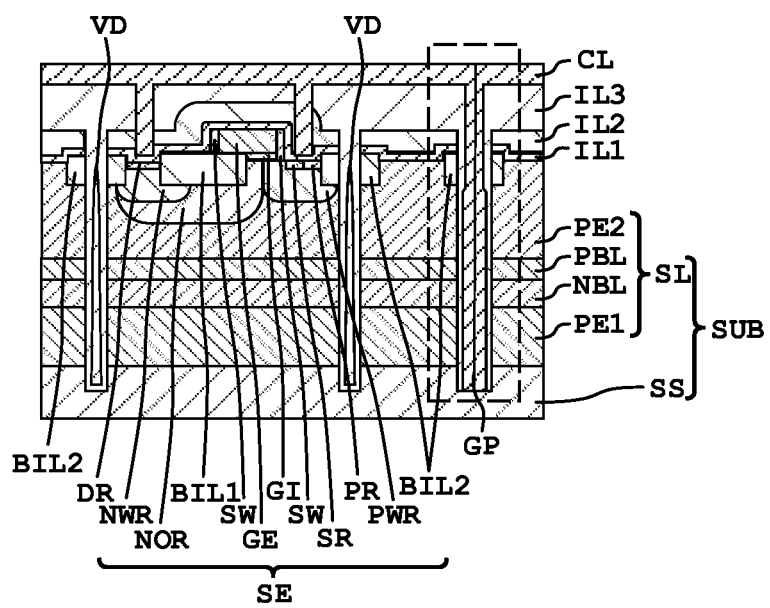
FIG. 9 is a cross-sectional view showing an exemplary step included in the method of manufacturing the semiconductor device according to the embodiment.
Figure 10:
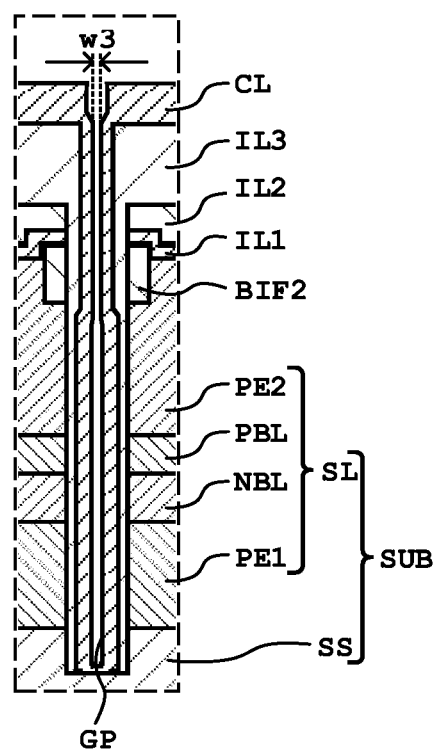
FIG. 10 is a cross-sectional view showing an exemplary step included in the method of manufacturing the semiconductor device according to the embodiment.

Substantially, as shown in FIGS. 9 and 10, a conductive layer CL is formed. Specifically, the conductive layer CL is formed on the third insulating layer IL3 so as to bury the second opening OP2 and the contact hole CH. The method of forming the conductive layer CL is, for example, sputtering method.

The conductive layer CL is, for example, a stacked film of a barrier metal film and a conductive film. Examples of materials for the barrier metal film include titanium (Ti), titanium nitride (TiN), tantalum (Ta), and tantalum nitride (TaN). Examples of the material of the conductive film include tungsten (W).

As shown in FIG. 10, the conductive layer CL is buried in the second opening OP2 so that a gap GP is formed along the thickness direction of the semiconductor layer SL. The gap GP is formed so as not to reach a bottom surface of the second opening OP2. In other words, the conductive layer CL is formed between a bottom portion of the gap GP and a bottom portion of the second opening OP2.

From the viewpoint of improving the reliability of semiconductor device SD, the size of the gap GP is preferably small. The smaller the size of the gap GP, the more difficult it is for the chemical solution for CMP to enter the gap GP in the CMP step described later. As a result, it is possible to suppress the formation of a reaction product between the conductive layer CL and the chemical solution. An opening width w3 of the gap GP is preferably 50 nm or less, for example. The opening width w3 of the gap GP is, for example, the largest opening width of a portion of the gap GP located in the same plane as a main surface of third insulating layer IL3.

(9) Forming a Protective Layer PL

Figure 11:
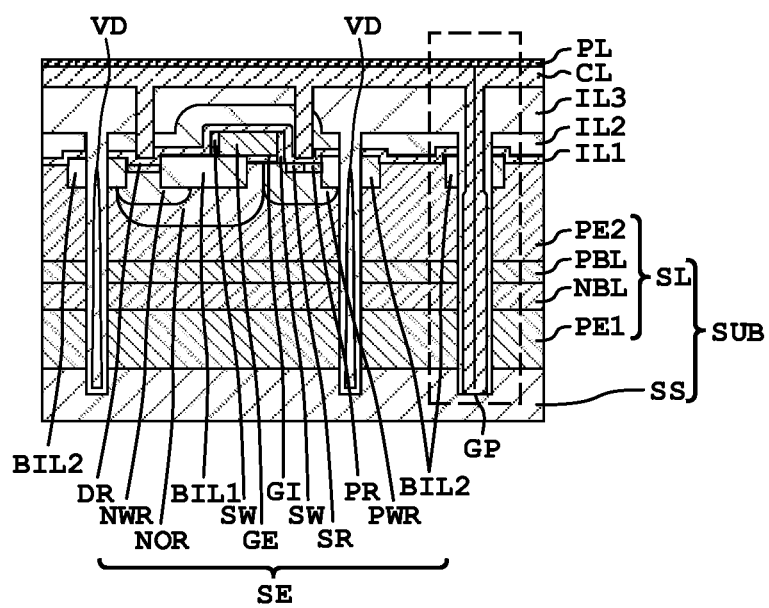
FIG. 11 is a cross-sectional view showing an exemplary step included in the method of manufacturing the semiconductor device according to the embodiment.
Figure 12:
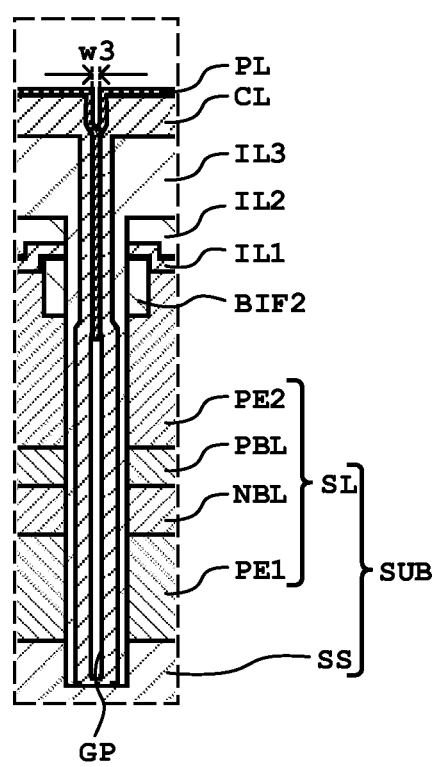
FIG. 12 is a cross-sectional view showing an exemplary step included in the method of manufacturing the semiconductor device according to the embodiment.

Substantially, as shown in FIGS. 11 and 12, a protective layer PL is formed on at least a portion of a surface of the conductive layer CL. In the present embodiment, the protective layer PL is formed on a portion of the surface of the conductive layer CL so as to close the gap GP. More specifically, the protective layer PL is formed to bury at least the upper portion of the gap GP in the gap GP. The protective layer PL may be formed so as to fill the lower portion of the gap GP or may be formed so as not to fill the lower portion of the gap GP. In the present embodiment, the protective layer PL is formed so as not fill the lower portion of the gap GP. In other words, the protective layer PL is formed on a surface of the conductive layer CL so that an inside of the gap GP does not communicate with an outside of the gap GP.

The method of forming the protective layer PL may be appropriately selected in accordance with the material of the protective layer PL. When the material of the protective layer PL is an oxide of the conductive layer CL, the method of forming the protective layer PL is, for example, oxygen plasma method (treatment). In the present embodiment, the oxide is tungsten oxide.

When the material of the protective layer PL is at least one selected from the group consisting of titanium (Ti), titanium nitride (TiN), and silicon (Si), the method of forming the protective layer PL is, for example, CVD method or sputtering method. For example, when silicon is used as the material of the protective layer PL, silane (SiH4) is used as the source gas.

The protective layer PL may be a stacked film of a silicon layer and a silicon oxide layer formed on the silicon layer. In this case, after the silicon layer is formed by the CVD method, the silicon oxide layer may be formed on the silicon layer by the oxygen plasma method.

A thickness of the protective layer PL may be any thickness as long as the protective layer PL can protect a surface of the conductive layer CL, and can be appropriately adjusted in accordance with the opening width w3 of the gap GP. In the present embodiment, the protective layer PL may bury the gap GP. The thickness of the protective layer PL is, for example, 5 nm or more and 50 nm or less.

(10) Performing CMP

Figure 13:
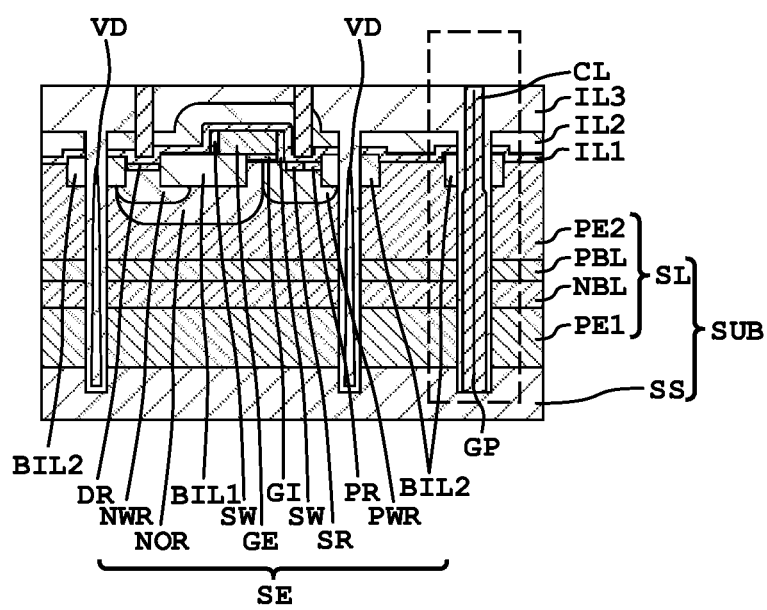
FIG. 13 is a cross-sectional view showing an exemplary step included in the method of manufacturing the semiconductor device according to the embodiment.
Figure 14:
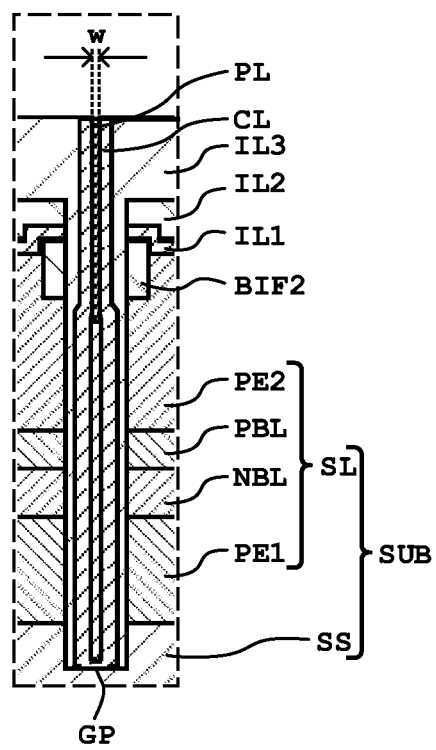
FIG. 14 is a cross-sectional view showing an exemplary step included in the method of manufacturing the semiconductor device according to the embodiment.

Substantially, as shown in FIGS. 13 and 14, a portion of the conductive layer CL formed outside the second opening OP2 and the contact hole CH is removed. More specifically, a portion of the conductive layer CL located on an upper surface of the third insulating layer IL3 is removed. The conductive layer CL is removed by CMP method. At this instance, the removal of the conductive layer CL is performed in a state in which a chemical solution for CMP is provided on the protective layer PL. In the present embodiment, since the gap GP of the conductive layer CL is closed by the protective layer PL, it is possible to suppress the chemical solution from entering the gap GP.

(11) Forming a Wiring Layer WRL

Figure 15:
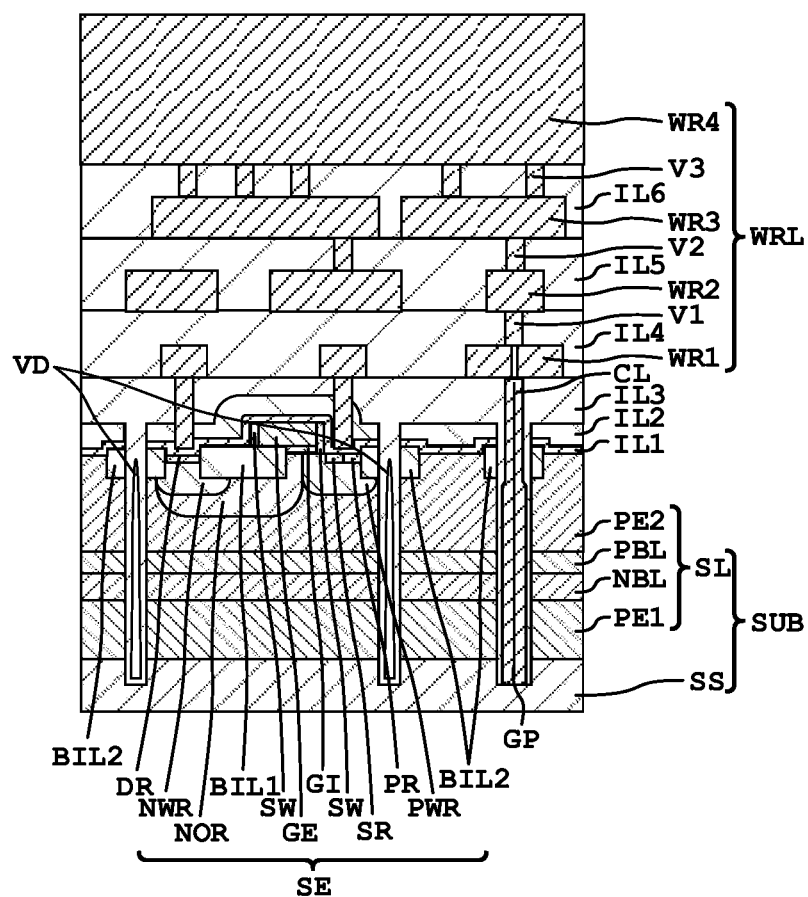
FIG. 15 is a cross-sectional view showing an exemplary step included in the method of manufacturing the semiconductor device according to the embodiment.

Substantially, as shown in FIG. 15, the wiring layer WRL is formed on the third insulating layer IL3. The step of forming the wiring layer WRL includes, for example, forming each of the fourth insulating layer IL4, the fifth insulating layer IL5, the sixth insulating layer IL6, the first wiring WR1, the second wiring WR2, the third wiring WR3, the fourth wiring WR4, the first via V1, the second via V2, and the third via V3. The wiring layer WRL may be formed in a manner similar to that known in the art for forming multilayer wiring layer.

(12) Forming a Passivation Film PV

Figure 16:
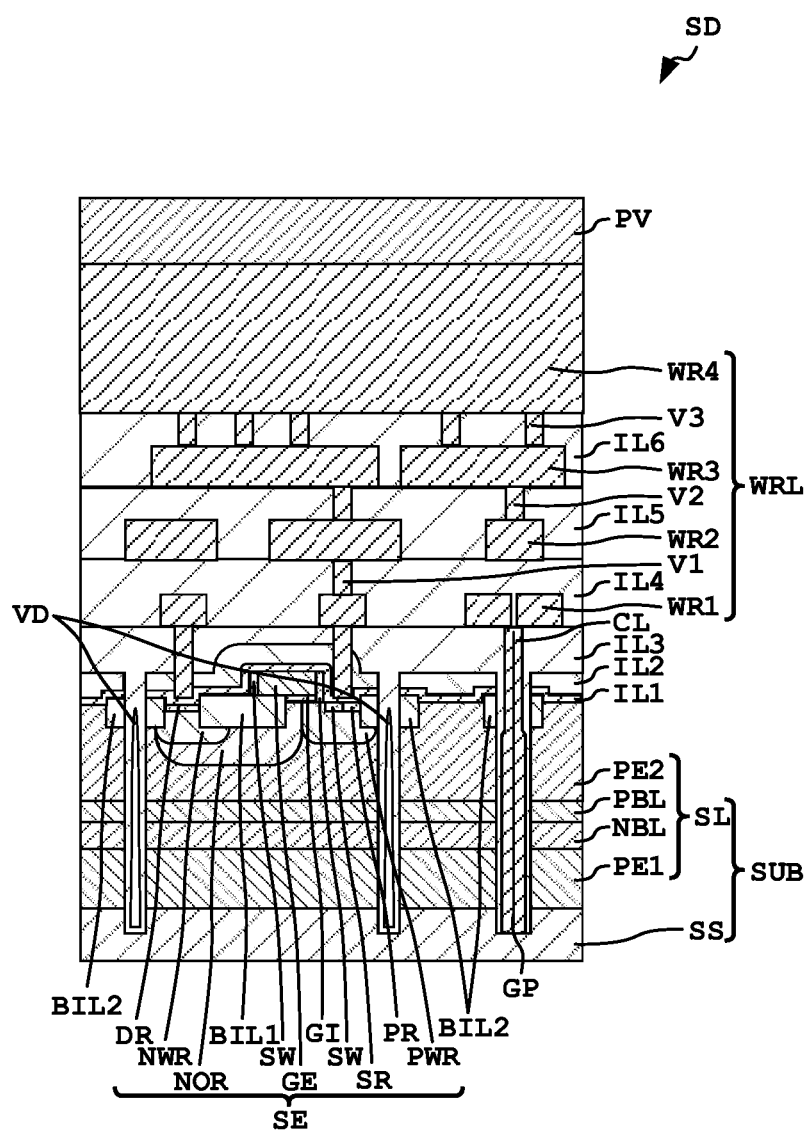
FIG. 16 is a cross-sectional view showing an exemplary step included in the method of manufacturing the semiconductor device according to the embodiment.

Substantially, as shown in FIG. 16, a passivation film PV is formed on the wiring layer WRL. The passivation film PV can be formed in the same manner as a method known as a method of forming a passivation film in semiconductor art.

The semiconductor device SD according to the present embodiment is manufactured by the above manufacturing method. The method of manufacturing the semiconductor device SD according to the present embodiment may further include other steps as required. For example, other steps may include implanting an impurity into a contacting portion of semiconductor substrate SS with the conductive layer CL. The other steps may be suitably employed from known method in the semiconductor art.

Effect of the Protective Layer PL

Figure 17:
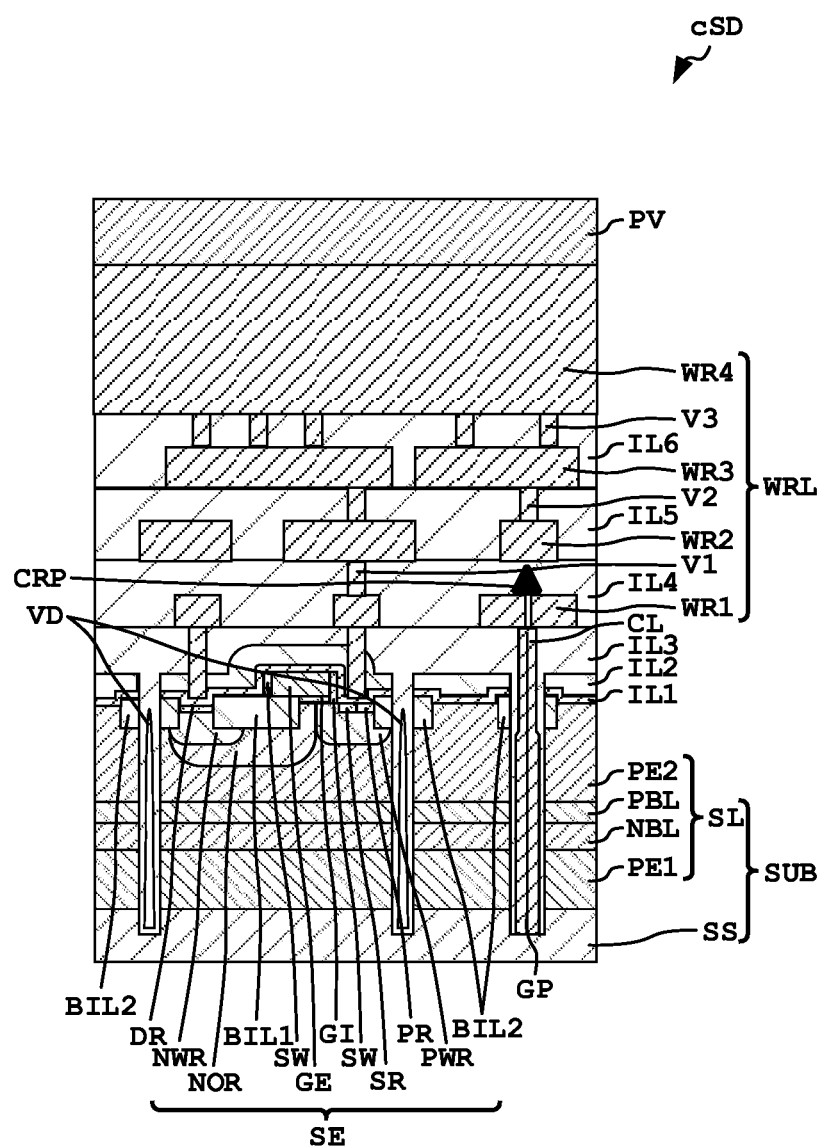
FIG. 17 is a cross-sectional view showing an exemplary configuration of a main portion of a comparative semiconductor device.

Here will be described the effect of the protective layer PL. For comparison, a structures of a semiconductor device cSD (hereinafter also referred to as "a comparative semiconductor device cSD") without the protective layer PL will be described. FIG. 17 is a cross-sectional view showing an exemplary configuration of a main portion of the comparative semiconductor device cSD. As shown in FIG. 17, in the comparative semiconductor device cSD, the chemical solution for CMP and the conductive layer CL react with each other, and a reaction product CRP may be deposited on the first wiring WR1. The reaction product CRP can cause the first wiring WR1 and the second wiring WR2 to short. The inventors' investigation has revealed that this occurs when the chemical solution for CMP enters the inside of the gap GP of the conductive layer CL and reacts with the material of the conductive layer CL.

On the other hand, in the method of manufacturing the semiconductor device SD according to the present embodiment, the gap GP of the conductive layer CL is closed by the protective layer PL. Therefore, the above-mentioned chemical solution is prevented from entering the gap GP. As a result, no product CRP is produced and unintentional short-circuiting of the first wiring WR1 and the second wiring WR2 can be suppressed.

(Configuration of the Semiconductor Device SD)

Figure 18:
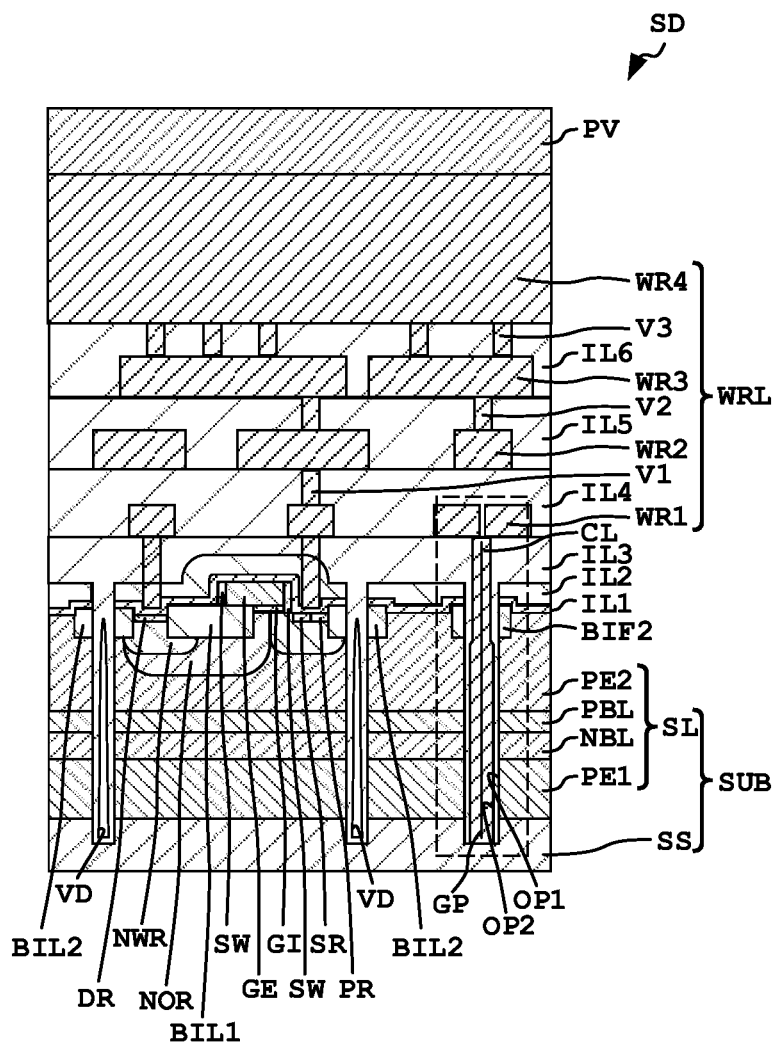
FIG. 18 is a cross-sectional view showing an exemplary configuration of a main portion of a semiconductor device according to an embodiment.
Figure 19:
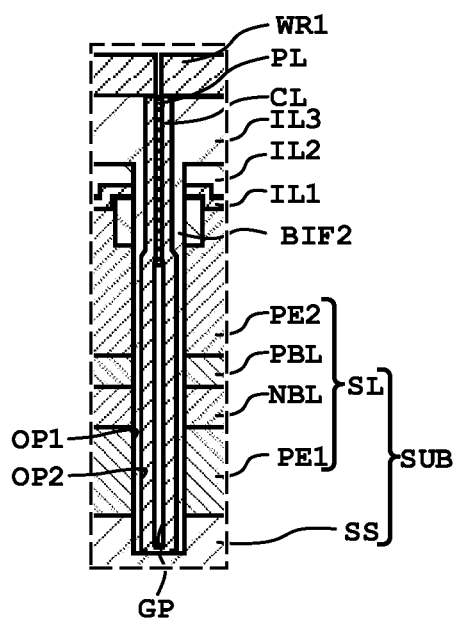
FIG. 19 is a partially enlarged cross-sectional view showing an area indicated by a broken line in FIG. 18.

FIG. 18 is a cross-sectional view showing an exemplary configuration of a main portion of the semiconductor device SD according to the present embodiment. FIG. 19 is an enlarged cross-sectional view of a portion of an area indicated by a broken line in FIG. 18. As shown in FIGS. 18 and 19, the semiconductor device SD according to the present embodiment includes the substrate SUB, the first insulating layer IL1, the second insulating layer IL2, the third insulating layer IL3, the conductive layer CL, the protective layer PL, the wiring layer WRL, and the passivation film PV. The semiconductor device SD may be manufactured by the method of manufacturing the semiconductor device SD described above. A thickness, material, position, and the like of the respective constituent elements are as described above.

As described above, the substrate SUB includes the semiconductor substrate SS and the semiconductor layer SL. The semiconductor layer SL is formed on the semiconductor substrate layer SS. The semiconductor layer SL is a stacked in which the first p-type epitaxial layer PE1, the n-type buried layer NBL, the p-type buried layer PBL, and the second p-type epitaxial layer PE2 are formed in this order. The semiconductor element SE is formed on the main surface of the substrate SUB. As described above, in the present embodiment, the semiconductor element SE is a lateral diffusion-type MOSFET(LDMOSFET). The second buried insulating layer BIL2 is formed on the main surface of the semiconductor layer SL.

The first insulating layer IL1 is formed on the substrate SUB such that the first insulating layer IL1 covers the semiconductor element SE and the second buried insulating layer BIL2. The second insulating layer IL2 is formed on the first insulating layer IL1. The first opening OP1 reaching the semiconductor substrate SS is formed in the first insulating layer IL1 and the second insulating layer IL2. The first opening OP1 penetrates the first insulating layer IL1, the second insulating layer IL2, the second buried insulating layer BIL2, and the semiconductor layer SL. At a bottom portion of the first opening OP1, the semiconductor substrate SS is exposed in the first opening OP1.

The third insulating layer IL 3 is formed on the inner surface of the first opening OP1 and on the second insulating layer IL2. The third insulating layer IL3 is formed with the second opening OP2 reaching the semiconductor substrate SS. At the bottom portion of the second opening OP2, the semiconductor substrate SS is exposed in second opening OP2.

The conductive layer CL is formed in the second opening OP2 such that the gap GP is formed along the thickness direction of the semiconductor layer SL. The conductive layer CL are so-called substrate contact electrically connecting the semiconductor substrate SS with the first wiring WR1. The third insulating layer IL3 is formed between the first p-type epitaxial layer PE1, the n-type buried layer NBL, the p-type buried layer PBL, the second p-type epitaxial layer PE2, and the conductive layer CL. Therefore, the first p-type epitaxial layer PE1, the n-type buried layer NBL, the p-type buried layer PBL, the second p-type epitaxial layer PE2, and the conductive layer CL are not in direct contact with each other.

In the present embodiment, the protective layer PL is formed on a portion of the conductive layer CL such that the protective layer PL closes the gap GP in the second opening OP2. It is preferable that the protective layer PL has conductivity from the viewpoint of reducing the electric resistivity between the semiconductor substrate SS and the first wiring WR1.

The conductive layer CL (substrate contact) may be formed outside the element forming region SFR (refer to FIG. 5) of the substrate SUB in plan view. The conductive layer CL may be formed such that the conductive layer CL surrounds the element formation region SFR in plan view, or may not be formed such that the conductive layer CL surrounds the element formation region SFR. In the present embodiment, the conductive layer CL is formed between one side surface of the substrate SUB and the element forming region SFR in plan view.

The wiring layer WRL is formed on the third insulating layer IL3. The configuration of the wiring layer WRLs is not particularly limited. The wiring layer WRL may include a plurality of wiring layers. In the present embodiment, the wiring layer WRL includes four wiring layers. A wiring constituting the wiring layer WRL may be aluminum wiring or copper wiring. In the present embodiment, the wiring constituting the wiring layer WRL is aluminum wiring.

The passivating layer PV is formed on the wiring layer WRL. The passivating film PV protects the semiconductor device SD.

Effect

In the method of manufacturing the semiconductor device SD according to the present embodiment, the CMP step is performed in a state in which the protective layer PL is formed on at least a portion of the conductive layer CL. In the present embodiment, the CMP process is performed with the protective layer PL blocking the gap GP of the conductive layer CL. This makes it difficult to generate the reaction product of the chemical solution for CMP and the conductive layer CL, causing a short circuit in the wiring layer WRL. As a result, the reliability of the semiconductor device SD can be improved.

First Modification

Figure 20:
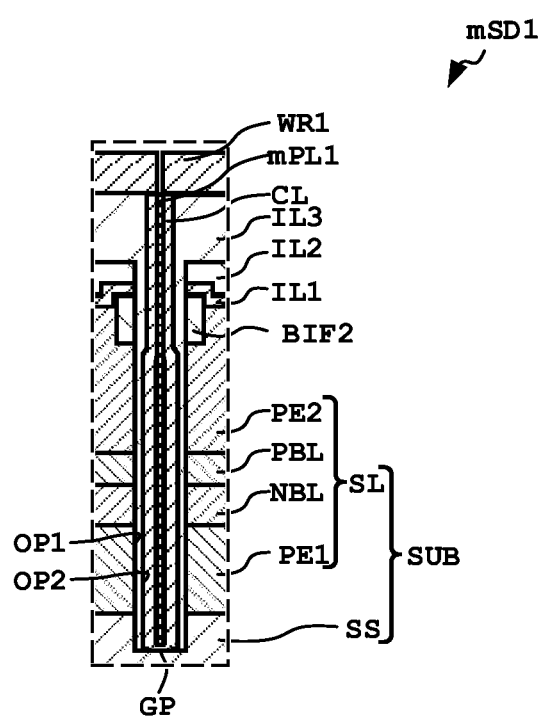
FIG. 20 is a partially enlarged cross-sectional view showing an exemplary configuration of a semiconductor device according to a first modification of the embodiment.

FIG. 20 is a partially enlarged cross-sectional view showing an exemplary configuration of a semiconductor device mSD1 according to a first modification of the present embodiment. As shown in FIG. 20, in the semiconductor device mSD1 according to the first modification, a protective layer mPL1 is formed on an entire surface of the conductive layer CL such that the entire of a surface of the gap GP is buried. As a result, the reliability of semiconductor device mSD1 can be further improved.

Second Modification

Figure 21:
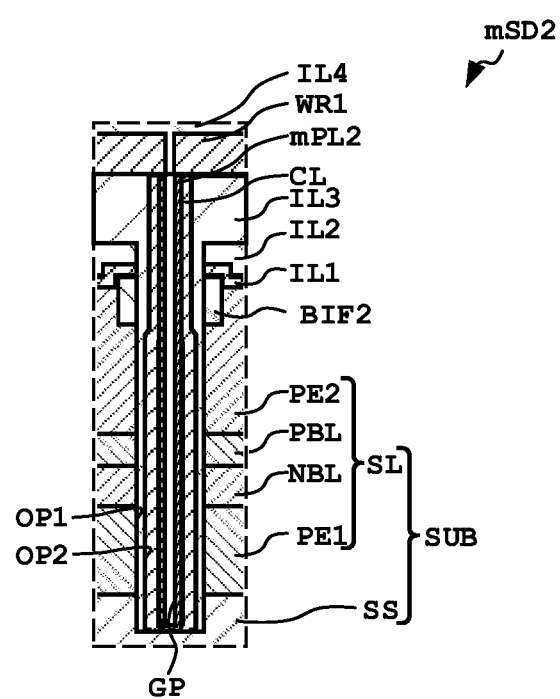
FIG. 21 is a partially enlarged cross-sectional view showing an exemplary configuration of a semiconductor device according to a second modification of the embodiment.

FIG. 21 is a partially enlarged cross-sectional view showing an exemplary configuration of a semiconductor device mSD2 according to of a second modification of the present embodiment. As shown in FIG. 21, in the semiconductor device mSD2 according to the second modification, a protective layer mPL2 is formed on an entire surface (inner surface) of the conductive layer CL such that the gap GP in second opening OP2 is not closed. As a result, even if the chemical solution for CMP enters the gap GP, the chemical solution for CMP can be prevented from contacting the conductive layer CL by the protective layer mPL2. Therefore, the formation of the reaction product between the chemical solution for CMP and the conductive layer CL can be suppressed. As a result, the reliability of the semiconductor device mSD2 can be improved.

It should be noted that the present invention is not limited to the above-mentioned embodiment, and various modifications can be made without departing from the gist thereof. Further, at least a part of each embodiment and each modification may be arbitrarily combined with each other.

In addition, even when a specific numerical value example is described, it may be a numerical value exceeding the specific numerical value, or may be a numerical value less than the specific numerical value, except when it is theoretically obviously limited to the numerical value. In addition, the component means "B containing A as a main component" or the like, and the mode containing other components is not excluded.

What is claimed is:

1. A method of manufacturing a semiconductor device, the method comprising:
   (a) providing a substrate comprising a semiconductor substrate and a semiconductor layer formed on the semiconductor substrate;
   (b) forming a first opening penetrating the semiconductor layer so as to reach the semiconductor substrate along a thickness direction of the semiconductor layer;
   (c) forming a first insulating layer in the first opening and on the substrate;
   (d) forming a second opening penetrating the first insulating layer so that the first insulating layer remains on an inner surface of the first opening and so that the semiconductor substrate is exposed from the first insulating layer;
   (e) embedding a conductive layer in the second opening to reach the semiconductor substrate;
   (f) forming a protective layer on at least a portion of a surface of the conductive layer; and
   (g) removing a portion of the conductive layer formed outside the second opening by a CMP method,
   wherein, in the (e), the semiconductor layer is embedded in the second opening so that a gap along the thickness direction of the semiconductor layer is formed, and
   wherein, in the (f), the protective layer is formed on a portion of the surface of the conductive layer so as to close the gap in second opening.

2. The method according to claim 1, wherein the protective layer is formed in the second opening on an entire of the surfaces of the conductive layer.

3. The method according to claim 1, wherein, in the (f), the conductive layers are made of tungsten.

4. The method of according to claim 1, wherein a material of the protective layer is an oxide of a material of the conductive layer.

5. The method according to claim 1, wherein a material of the protective layer is at least one material selected from the group consisting of titanium, titanium nitride and silicon.

6. The method according to claim 1, comprising (h), between the (f) and the (g), performing a plasma treatment to the protective layer, wherein the protective layer is made of silicone.

7. A semiconductor device comprising:
   a substrate comprising:
      a semiconductor substrate; and
      a semiconductor layer formed on the semiconductor substrate, wherein an opening extends such that the opening reaches the semiconductor substrate in a thickness direction of the semiconductor layer, and penetrates the semiconductor layer;
   a first insulating layer formed on an inner surface of the opening and on the substrate such that the semiconductor substrate is exposed in the opening;
   a conductive layer formed in the opening such that a gap along the thickness direction of the semiconductor layer is formed and such that the gap reaches semiconductor substrate;
   a protective layer formed on at least a portion of a surface of the conductive layer in the gap; and
   a second insulating layer formed between the substrate and the first insulating layer,
   wherein the opening penetrates the second insulating layer and the semiconducting layer such that the opening reaches the semiconductor substrate.

8. The semiconductor device according to claim 7, wherein the protective layer is formed on a portion of the surface the conductive layer such that the gap is closed in the opening.

9. The semiconductor device according to claim 7, wherein the protective layer is formed in the opening on an entire of the surfaces of the conductive layer.

10. The semiconductor device according to claim 7, wherein the conductive layer comprises tungsten.

11. The semiconductor device according to claim 7, wherein a material of the protective layer is an oxide of a material of the conductive layer.

12. The semiconductor device according to claim 7, wherein a material of the protective layer is at least one material selected from the group consisting of titanium, titanium nitride and silicon.

13. The semiconductor device according to claim 7, wherein the protective layer comprises:
   a silicon layer; and
   a silicon oxide layer formed on the silicon layer.

14. A semiconductor device comprising:
   a substrate comprising:
      a semiconductor substrate; and
      a semiconductor layer formed on the semiconductor substrate, wherein an opening extends such that the opening reaches the semiconductor substrate in a thickness direction of the semiconductor layer, and penetrates the semiconductor layer;
   a first insulating layer formed on an inner surface of the opening and on the substrate such that the semiconductor substrate is exposed in the opening;
   a conductive layer formed in the opening such that a gap along the thickness direction of the semiconductor layer is formed and such that the gap reaches semiconductor substrate; and a protective layer formed on at least a portion of a surface of the conductive layer in the gap, wherein the protective layer is formed on a portion of the surface the conductive layer such that the gap is closed in the opening.

* * * * *